(12) United States Patent
Bae et al.

(10) Patent No.: US 11,652,090 B2
(45) Date of Patent: May 16, 2023

(54) SEMICONDUCTOR PACKAGE AND METHOD FOR FABRICATING THE SAME

(71) Applicant: SAMSUNG ELECTRONICS CO., LTD., Suwon-si (KR)

(72) Inventors: Min Jun Bae, Yongin-si (KR); Dong Kyu Kim, Anyang-si (KR); Jin-Woo Park, Seoul (KR); Seok Hyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 16/885,391

(22) Filed: May 28, 2020

(65) Prior Publication Data

US 2021/0111163 A1 Apr. 15, 2021

(51) Int. Cl.
*H01L 25/10* (2006.01)
*H01L 25/065* (2023.01)
*H01L 25/00* (2006.01)

(52) U.S. Cl.
CPC ........ *H01L 25/105* (2013.01); *H01L 25/0652* (2013.01); *H01L 25/50* (2013.01); *H01L 2225/0651* (2013.01); *H01L 2225/06506* (2013.01); *H01L 2225/06562* (2013.01); *H01L 2225/06582* (2013.01); *H01L 2225/1035* (2013.01); *H01L 2225/1041* (2013.01)

(58) Field of Classification Search
CPC .... H01L 25/105; H01L 25/0652; H01L 25/50
See application file for complete search history.

(56) References Cited

U.S. PATENT DOCUMENTS

| | | | |
|---|---|---|---|
| 8,890,329 B2 | 11/2014 | Kim et al. | |
| 9,607,967 B1 | 3/2017 | Shih | |
| 9,633,974 B2 | 4/2017 | Zhai et al. | |
| 9,679,801 B2 | 6/2017 | Lai et al. | |
| 9,698,122 B2 | 7/2017 | Kuo | |
| 10,109,617 B2 | 10/2018 | Lee et al. | |
| 2014/0091471 A1* | 4/2014 | Chen | H01L 25/18 257/770 |
| 2017/0025380 A1 | 1/2017 | Zhai et al. | |
| 2018/0026022 A1* | 1/2018 | Lee | H01L 23/3128 257/659 |
| 2018/0076184 A1* | 3/2018 | Chen | H01L 24/73 |
| 2018/0337136 A1 | 11/2018 | Han et al. | |
| 2019/0115299 A1 | 4/2019 | Hsieh et al. | |
| 2019/0131273 A1 | 5/2019 | Chen et al. | |

* cited by examiner

*Primary Examiner* — Errol V Fernandes

(74) *Attorney, Agent, or Firm* — F. Chau & Associates, LLC

(57) ABSTRACT

A semiconductor package includes a first redistribution layer. A plurality of posts is disposed on the first redistribution layer. A semiconductor chip is disposed on the first redistribution layer between the plurality of posts. A second redistribution layer is formed on the plurality of posts and the semiconductor chip. A first memory stack is disposed on the second redistribution layer. A height of each of the plurality of posts extends from an upper surface of the first redistribution layer to a lower surface of the second redistribution layer.

20 Claims, 12 Drawing Sheets

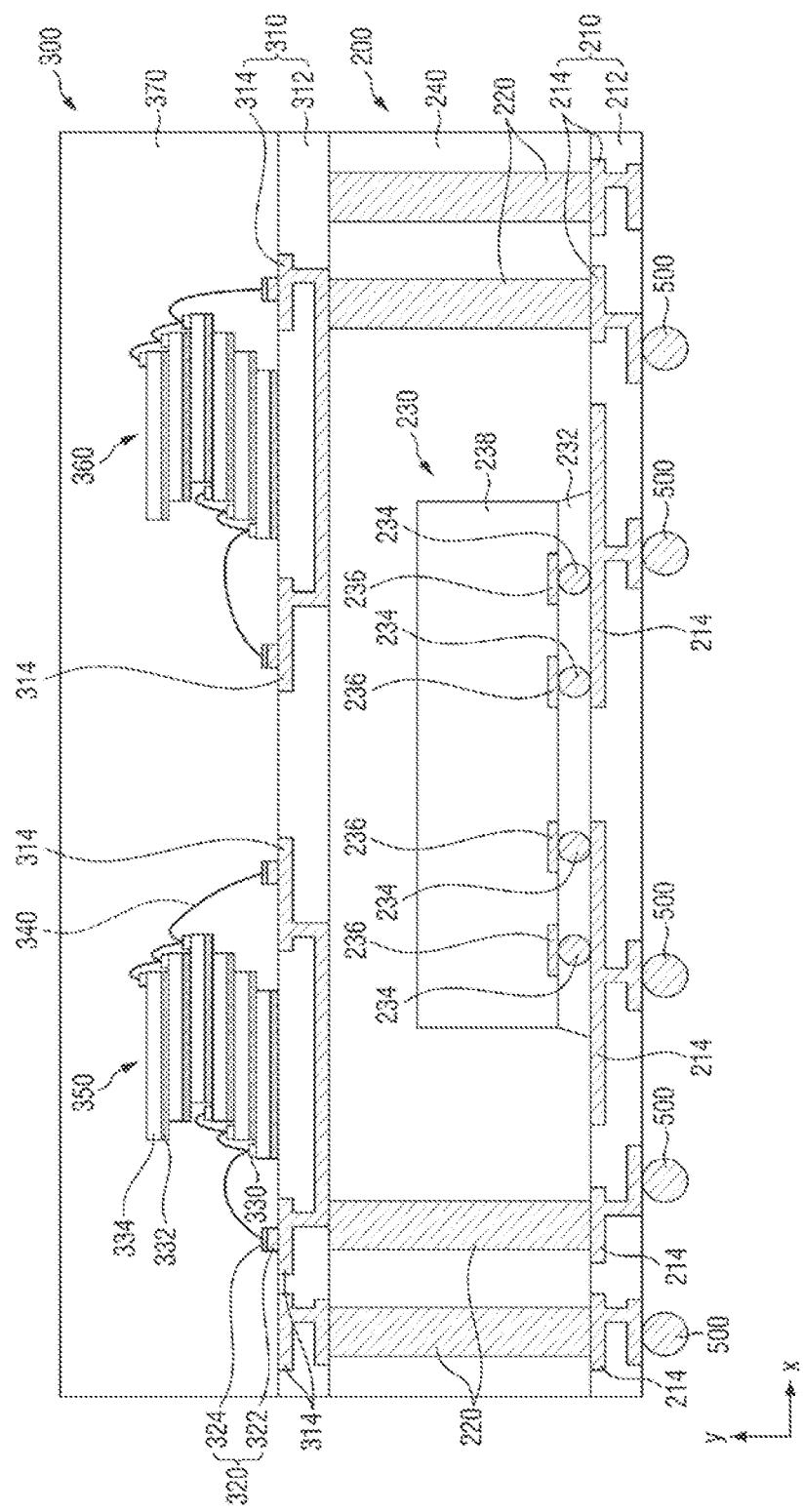

SEMICONDUCTOR PACKAGE AND METHOD FOR FABRICATING THE SAME

CROSS-REFERENCE TO RELATED APPLICATION

This application claims priority under 35 U.S.C. § 119 to Korean Patent Application No. 10-2019-0127727, filed on Oct. 15, 2019 in the Korean Intellectual Property Office, the disclosure of which is incorporated by reference in its entirety herein.

TECHNICAL FIELD

The present inventive concepts relate to a semiconductor package and a method for fabricating the same.

DISCUSSION OF RELATED ART

Integrated circuits may be fabricated on a single semiconductor wafer. The single semiconductor wafer may be divided into a plurality of chips that are packaged separately from each other. Recently, semiconductor devices have become smaller and higher in performance. An increased integration of components in a given area of the semiconductor device is desirable for providing smaller and higher performance semiconductor devices.

Wafer level packaging may be used as a miniaturized packaging method for a semiconductor device. Wafer level packaging may generally include a redistribution layer (RDL). The redistribution layer may be used for fan-out wiring for contact pads of integrated circuit dies. The size of the semiconductor package may be reduced by using the redistribution layer.

SUMMARY

Exemplary embodiments of the present inventive concepts provide a semiconductor package with improved product reliability.

Exemplary embodiments of the present inventive concepts also provide a method for fabricating a semiconductor package with improved product reliability.

Exemplary embodiments of the present inventive concepts also provide a method of fabricating a semiconductor device that may prevent damage to an interlayer insulating film and prevent defects between the interlayer insulating film and a via during a process of forming an inter-metal via and improve the performance and reliability of the semiconductor device.

According to an exemplary embodiment of the present inventive concepts, a semiconductor package includes a first redistribution layer. A plurality of posts is disposed on the first redistribution layer. A semiconductor chip is disposed on the first redistribution layer between the plurality of posts. A second redistribution layer is formed on the plurality of posts and the semiconductor chip. A first memory stack is disposed on the second redistribution layer. A height of each of the plurality of posts extends from an upper surface of the first redistribution layer to a lower surface of the second redistribution layer.

According to an exemplary embodiment of the present inventive concepts, a method for fabricating a semiconductor package includes forming a first redistribution layer. A plurality of posts is formed on the first redistribution layer. A semiconductor chip is disposed on the first redistribution layer between the plurality of posts. A second redistribution layer is formed on the plurality of posts and the semiconductor chip. A first memory stack is formed on the second redistribution layer. Each of the plurality of posts has a height that extends from an upper surface of the first redistribution layer to a lower surface of the second redistribution layer.

According to an exemplary embodiment of the present inventive concepts, a semiconductor package includes a plurality of external connection terminals. A first redistribution layer is disposed on the plurality of external connection terminals. The first redistribution layer includes a first dielectric layer and a first redistribution pattern electrically connected to the plurality of external connection terminals. A plurality of posts is disposed on the first redistribution layer. A semiconductor chip is disposed on the first redistribution layer between the plurality of posts. A first mold layer surrounds the plurality of posts and the semiconductor chip. A second redistribution layer is disposed on the first mold layer and the plurality of posts. The second redistribution layer includes a second dielectric layer and a second redistribution pattern electrically connected to the plurality of posts. A plurality of memory stacks is disposed on the second redistribution layer. The plurality of memory stacks are wire bonded to the second redistribution layer. A height of each of the plurality of posts extends from an upper surface of the first redistribution layer to a lower surface of the second redistribution layer.

However, aspects of the present inventive concepts are not restricted to those set forth herein. The above and other aspects of the present inventive concepts will become more apparent to one of ordinary skill in the art to which the present disclosure pertains by referencing the detailed description of exemplary embodiments of the present inventive concepts given below.

BRIEF DESCRIPTION OF THE DRAWINGS

The above and other aspects and features of the present inventive concepts will become more apparent by describing in detail exemplary embodiments thereof with reference to the attached drawings, in which:

FIG. 13 is a cross-sectional view illustrating a semiconductor package according to another exemplary embodiment of the present inventive concepts.

DETAILED DESCRIPTION OF EXEMPLARY EMBODIMENTS

Figure 1:
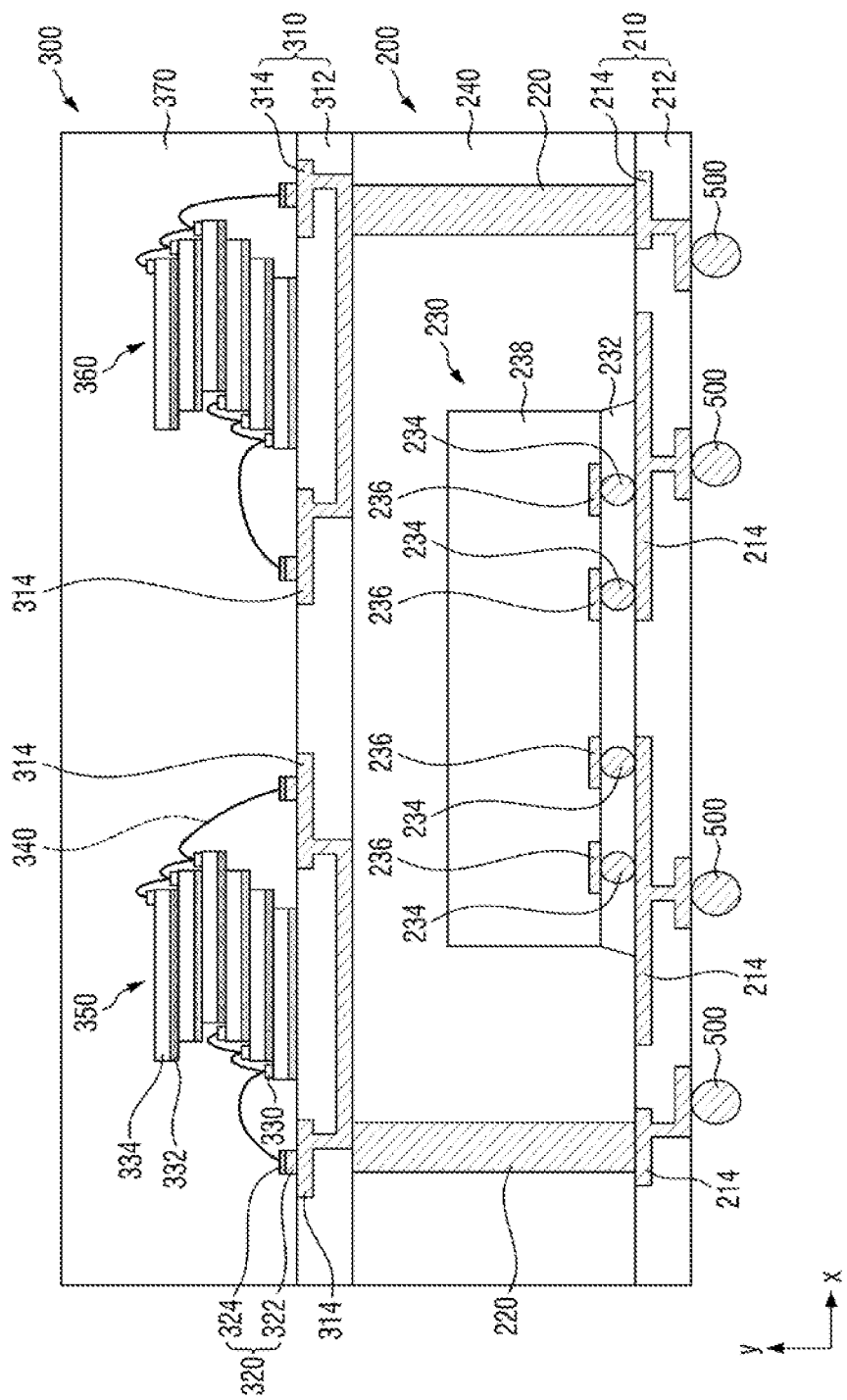
FIG. 1 is a cross-sectional view illustrating a semiconductor package according to an exemplary embodiment of the present inventive concepts.

FIG. 1 is a cross-sectional view illustrating a semiconductor package according to an exemplary embodiment of the present inventive concepts.

Referring to the exemplary embodiment of FIG. 1, a semiconductor package includes a first package 200 and a second package 300.

The first package 200 may include a first redistribution layer 210 disposed on a plurality of external connection terminals 500. For example, as shown in the exemplary embodiment of FIG. 1, an upper surface of the external connection terminals 500 may directly contact a lower surface of the first redistribution layer 210. The first package 200 may further include a plurality of posts 220 disposed on the first redistribution layer 210 and spaced apart from each other in an X direction that is parallel to an upper surface of the first redistribution layer 210. The first package 200 may further include, a semiconductor chip 230 and a first mold layer 240 disposed on the first redistribution layer 210 (e.g., in a Y direction that is perpendicular to the X direction).

The plurality of external connection terminals 500 may be electrically connected to the outside. For example, the plurality of external connection terminals 500 may electrically connect the semiconductor chip 230 to another external semiconductor package. Alternatively, the plurality of external connection terminals 500 may electrically connect the semiconductor chip 230 with another semiconductor element. However, exemplary embodiments of the present inventive concepts are not limited thereto.

Although the exemplary embodiment of FIG. 1 shows the plurality of external connection terminals 500 as solder balls, exemplary embodiments of the present inventive concepts are not limited thereto. For example, in another exemplary embodiment, the plurality of external connection terminals 500 may be solder bumps, grid arrays, conductive tabs, etc. In addition, the number of the plurality of external connection terminals 500 is not limited to the number shown in the exemplary embodiment of FIG. 1 and the number of the plurality of external connection terminals 500 may vary. A description overlapping with the above description relating to the plurality of external connection terminals 500 will be omitted below for convenience of explanation.

The first redistribution layer 210 may be disposed on the plurality of external connection terminals 500 (e.g., in the Y direction). The first redistribution layer (RDL) 210 may include a first dielectric layer 212 and a first redistribution pattern 214. The first redistribution pattern 214 may be formed between the first dielectric layers 212 and may extend from a lower surface of the first redistribution layer 210 to an upper surface of the first redistribution layer 210. As shown in the exemplary embodiment of FIG. 1, the first redistribution layer 210 may include a plurality of discrete first redistribution patterns 214 formed between the first dielectric layers 212.

In an exemplary embodiment, the first dielectric layer 212 may be formed of a polymer. For example, the polymer may be a photosensitive material such as polybenzoxazole (PBO), polyimide, benzocyclobutene (BCB) or the like, which can be easily patterned using a photolithography process. However, exemplary embodiments of the present inventive concepts are not limited thereto. In some other exemplary embodiments, the first dielectric layer 212 may be formed of a nitride such as silicon nitride, an oxide such as silicon oxide, phosphosilicate glass (PSG), borosilicate glass (BSG), boron-doped phosphosilicate glass (BPSG) or the like. A description overlapping with the above description relating to the dielectric layer will be omitted below for convenience of explanation.

The first redistribution pattern 214 may electrically connect the plurality of external connection terminals 500 to the plurality of posts 220. For example, as shown in the exemplary embodiment of FIG. 1, an upper surface of the first redistribution pattern 214 may directly contact a lower surface of the post 220 and a lower surface of the first redistribution pattern 214 may directly contact the external connection terminals 500. Further, the first redistribution pattern 214 may electrically connect the plurality of external connection terminals 500 to the semiconductor chip 230.

In an exemplary embodiment, the first redistribution pattern 214 may be formed by forming a seed layer on the first dielectric layer 212, and forming a patterned mask on the seed layer to perform metal plating on the exposed seed layer. The first redistribution pattern 214 may be formed to have the shapes as shown in the exemplary embodiment of FIG. 1 through at least a portion of the patterned mask and the seed layer covered by the patterned mask. In an exemplary embodiment, the seed layer may be formed using physical vapor deposition (PVD). However, exemplary embodiments of the present inventive concepts are not limited thereto. In an exemplary embodiment, the plating may be performed using electroless plating. Although it is illustrated that one redistribution layer is provided on the plurality of external connection terminals 500 of the first package 200, exemplary embodiments of the present inventive concepts are not limited thereto and the number of redistribution layers may vary. A description overlapping with the above description relating to the redistribution layer will be omitted below for convenience of explanation.

As shown in the exemplary embodiment of FIG. 1, a plurality of posts 220 may be disposed on the first redistribution layer 210. For example, a lower surface of the posts 220 may be formed on an upper surface of the first redistribution layer 210. In an exemplary embodiment, the plurality of posts 220 may be formed by plating. In an exemplary embodiment, the plurality of posts 220 may be formed by forming a blanket seed layer on the first redistribution layer 210, and then forming and patterning a photoresist on the seed layer exposed through openings in the photoresist. In this embodiment, the height of each of the plurality of posts 220 may extend from an uppermost surface of the first redistribution layer 210 to a lowermost surface of a second redistribution layer 310. The photoresist and the seed layer covered by the photoresist may then be removed. In an exemplary embodiment, electrode pads may be formed above and below the plurality of posts. The electrode pads disposed above and below the plurality of posts may have a rod, circular, rectangular, square, or hexagonal shape. However, exemplary embodiments of the present inventive concepts are not limited thereto.

The plurality of posts 220 may be arranged in rows and columns. The plurality of posts 220 may electrically connect a first surface (e.g., lower surfaces) of the plurality of posts that contacts the first redistribution layer 210 to a second surface (e.g., upper surfaces) of the plurality of posts that contacts a lower surface of the second redistribution layer 310. In an exemplary embodiment, the plurality of posts 220 may include gold (Au), silver (Ag), copper (Cu), nickel (Ni), or aluminum (Al). However, exemplary embodiments of the present inventive concepts are not limited thereto. In addition, the plurality of posts 220 may be used as alignment marks.

The semiconductor chip 230 may be disposed on the first redistribution layer 210 between the plurality of posts 220 (e.g., in the X direction). The semiconductor chip 230 may be mounted on the first redistribution layer 210. In an exemplary embodiment, the semiconductor chip 230 may be a flip chip. However, exemplary embodiments of the present inventive concepts are not limited thereto. A description overlapping with the above description relating to the plurality of posts 220 will be omitted below for convenience of explanation.

The semiconductor chip 230 may include a body layer 238 including an upper surface and a lower surface facing each other in the Y direction, lateral side surfaces facing each other in the X direction, a plurality of internal connection pads 236 included in the lower surface of the body layer 238, an underfill 232 disposed on the lower surface of the body layer 238, and a plurality of internal connection terminals 234 formed inside the underfill 232. For example, as shown in the exemplary embodiment of FIG. 1, a lower surface of the internal connection terminals 234 may directly contact the first redistribution pattern 214 on an upper surface of the first redistribution layer 210. An upper surface of the internal connection terminal 234 may directly contact a lower surface of the internal connection pads 236 disposed on a lower surface of the body layer 238. An active region for performing an electrical operation may be formed on the lower surface of the semiconductor chip 230. In an exemplary embodiment, the upper surface of the body layer 238 in the semiconductor chip 230 may be located on a plane that is lower (e.g., in the Y direction) than an upper surface of the plurality of posts 220. However, exemplary embodiments of the present inventive concepts are not limited thereto.

In an exemplary embodiment, the semiconductor chip 230 may be, for example, a logic chip (e.g., an application processor (AP)). However, exemplary embodiments of the present inventive concepts are not limited thereto. For example, in another exemplary embodiment, the semiconductor chip 230 may include a power management integrated circuit (PMIC) chip, etc.

As described below, the semiconductor chip 230 may be formed by a chip last method. For example, the semiconductor chip 230 may be formed after the first redistribution layer 210 is formed.

In an exemplary embodiment, the internal connection pads 236 includes a plurality of pads disposed in the body layer 238. However, exemplary embodiments of the present inventive concepts are not limited thereto. For example, in another exemplary embodiment, at least one of the plurality of internal connection pads 236 may protrude from the body layer 238. The plurality of internal connection pads 236 may be spaced apart from each other, and the number of the plurality of internal connection pads 236 is not limited to the number shown in the drawing.

In an exemplary embodiment, the plurality of internal connection pads 236 may include a conductive material, such as a metal material. For example, the plurality of internal connection pads 236 may include at least one metal material selected from nickel (Ni), gold (Au), and the like. In addition, the functions of the plurality of internal connection pads 236 may be different from each other.

The plurality of internal connection terminals 234 may be disposed on the plurality of internal connection pads 236. The plurality of internal connection terminals 234 may electrically connect the semiconductor chip 230 to the first redistribution layer 210. For example, the plurality of internal connection terminals 234 may be electrically connected to the first redistribution pattern 214 in the first redistribution layer 210. In an exemplary embodiment, the plurality of internal connection terminals 234 may be solder balls, solder bumps, or a combination thereof. However, exemplary embodiments of the present inventive concepts are not limited thereto.

The underfill 232 may be formed in an empty space between the first redistribution layer 210 and the lower surface of the body layer 238. The underfill 232 may reduce the magnitude of a physical impact absorbed by the semiconductor chip 230. In an exemplary embodiment, the underfill 232 may be an insulating resin. However, exemplary embodiments of the present inventive concepts are not limited thereto. Further, the shape of the underfill 232 is not limited to the shape shown in the drawing. A description overlapping with the above description relating to the semiconductor chip 230 will be omitted below for convenience of explanation.

The first mold layer 240 is disposed on the first redistribution layer 210 and between the plurality of posts 220 and the semiconductor chip 230. In an exemplary embodiment, the first mold layer 240 of the semiconductor package may include an epoxy molding compound. However exemplary embodiments of the present inventive concepts are not limited thereto.

The first mold layer 240 may be in contact with the plurality of posts 220. As described above, the plurality of posts 220 may include, for example, gold (Au), silver (Ag), copper (Cu), nickel (Ni), or aluminum (Al). The plurality of posts 220 may include oxide due to contact with the first mold layer 240. For example, the plurality of posts 220 may include gold oxide, silver oxide, copper oxide, nickel oxide or aluminum oxide. A description overlapping with the above description relating to the first mold layer 240 will be omitted below for convenience of explanation.

The second package 300 may include a second redistribution layer 310, a plurality of connecting pads 320, a plurality of memory stacks (e.g., a first memory stack 350 and a second memory stack 360), and a second mold layer 370. Hereinafter, the first memory stack 350 and the second memory stack 360 may be collectively referred to as a plurality of memory stacks 350 and 360.

The second package 300 may be disposed on the first package 200 (e.g., in the Y direction). For example, the second package 300 may be formed on upper surfaces of the plurality of posts 220 and the first mold layer 240.

For example, as shown in the exemplary embodiment of FIG. 1, the second redistribution layer 310 may be formed on the plurality of posts 220 and the first mold layer 240. A lower surface of the second redistribution layer 310 may directly contact upper surfaces of the plurality of posts 220 and the first mold layer 240. The second redistribution layer 310 may include a second dielectric layer 312 and a second redistribution pattern 314. The second redistribution pattern 314 may be formed between the second dielectric layers 312 and may extend from a lower surface of the second redistribution layer 310 to an upper surface of the second redistribution layer 310. As shown in the exemplary embodiment of FIG. 1, the second redistribution layer 310 may include a plurality of discrete second redistribution patterns 314 formed between the second dielectric layers 312.

The second redistribution pattern 314 may electrically connect the plurality of posts 220 to the plurality of memory stacks 350 and 360, respectively.

In the semiconductor package according to an exemplary embodiment of the present inventive concepts, electrical connection between the first package 200 and the second package 300 may be achieved through the second redistribution layer 310. For example, the first package 200 and the second package 300 may be connected at a thinner thickness than in embodiments in which the first package 200 and the second package 300 are connected through the PCB, thereby thinning the entire thickness of the semiconductor package. In addition, the second redistribution layer 310 may have a low wiring resistance due to a relatively short electrical connection path.

Hereinafter, an electrical connection method of the second redistribution pattern 314 and the plurality of memory stacks 350 and 360 will be described.

A plurality of connecting pads 320 may be disposed on the second redistribution pattern 314. Each of the plurality of connecting pads 320 may include a connection pad body 322 and connection pad plating 324 disposed on the connection pad body 322. For example, as shown in the exemplary embodiment of FIG. 1, a lower surface of each of the connecting pads 320 may directly contact an upper surface of the second redistribution pattern 314 on the second redistribution layer 310. A lower surface of the connection pad plating 324 may directly contact an upper surface of the connection pad body 322.

The connection pad body 322 may include a conductive material, such as a metal material. For example, in an exemplary embodiment, the connection pad body 322 may include at least one conductive material selected from nickel (Ni), gold (Au), and the like.

The connection pad plating 324 may improve electrical connection reliability between the connection pad body 322 and the plurality of memory stacks 350 and 360. In an exemplary embodiment, the connection pad plating 324 may be formed by performing gold plating on the connection pad body 322. However, exemplary embodiments of the present inventive concepts are not limited thereto.

In an exemplary embodiment, one of the gold plating methods may be electroless nickel-palladium-gold plating (e.g., Electroless Nickel Electroless Palladium Electroless Gold). In the electroless nickel-palladium-gold plating, after performing pre-treatment such as cleaning on the connection pad body 322 and applying a palladium catalyst, electroless nickel plating treatment, electroless palladium plating treatment and electroless gold plating treatment may be sequentially performed.

In another exemplary embodiment, the gold plating method may be ENEPIG (Electroless Nickel Electroless Palladium Immersion Gold). In the ENEPIG method, immersion gold plating treatment may be performed.

As described above, in the gold plating according to some exemplary embodiments, since electroless gold plating does not use an electrode unlike electrolytic gold plating, regardless of the formation of the connection pad body 322, the connection pad plating 324 having excellent adhesion and uniformity may be formed.

Each of the memory stacks 350 and 360 may be formed by stacking an adhesive film 332 and a memory chip 334 on the adhesive film 332 (e.g., in the Y direction). Hereinafter, the first memory stack 350 of the plurality of memory stacks 350 and 360 will be described as an example. The description of the first memory stack 350 may also apply to the second memory stack 360.

The adhesive film 332 may provide adhesion of the second redistribution layer 310. For example, the adhesive film 332 may provide adhesion between the second dielectric layer 312 and the memory chip 334. In addition, the adhesive film 332 may provide adhesion between the memory chips 334. The plurality of memory stacks 350 and 360 may each include a plurality of adhesive film layers alternatingly stacked with a plurality of memory chips 334.

In an exemplary embodiment, the adhesive film 332 may be a liquid adhesive made of epoxy paste. For example, when the individual memory chips 334 are attached to a substrate or lead frame through the adhesive film 332, a dispensing adhesive application method may be used. However, exemplary embodiments of the present inventive concepts are not limited thereto. For example, in an alternative exemplary embodiment, a die attach film (DAF) may be used as the adhesive film 332. The type of the adhesive film 332 is not limited thereto.

Each of the memory chips 334 may include input/output pads 330 for inputting and outputting signals. The memory chips 334 may be stacked on each other through the adhesive film 332, and the memory chips 334 may be stacked while exposing the input/output pads 330 of the memory chips 334 located therebelow. For example, as shown in the exemplary embodiment of FIG. 1, the input/output pads 330 may be positioned on or near a lateral end of the memory chips 334 and the memory chips 334 may be stacked in a staggered relationship so that the input/output pads 330 are exposed on steps formed on the lateral ends of the memory chips 334. In addition, the memory chips 334 may be stacked while maintaining or changing a stepwise direction. For example, as shown in the exemplary embodiment of FIG. 1, the lower three memory chips 334 may be staggered to have a stepwise direction in a first direction in the X direction and the upper three memory chips 334 may be staggered to have a stepwise direction in a second direction (e.g., an opposite direction) in the X direction. Each of the memory chips 334 may be electrically connected to the second redistribution layer 310. For example, each of the connecting pads 320 are connected to the second redistribution pattern 314. The input/output pads 330 on the memory chips 334 are connected to the connection pad plating 324 via wires 340.

In an exemplary embodiment, some of the plurality of connecting pads 320 to which at least one of the memory chips 334 of the first memory stack 350 are wire bonded may be different from the rest of the plurality of connecting pads 320 to which the remaining memory chips 334 of the first memory stack 350 are wire bonded. For example, as shown in the exemplary embodiment of FIG. 1, the lower three memory chips 334 may be connected to a first connecting pad and the upper three memory chips 334 may be connected to a second connecting pad that is spaced apart from the first connecting pad in the X direction. However, each of the memory chips 334 of the first memory stack 350 may be electrically connected to the second redistribution pattern 314 to transmit and receive a signal through a portion of the plurality of posts 220.

In an exemplary embodiment, the memory chip 334 may be a NAND-type flash memory. In another exemplary embodiment, the memory chip 334 may be a phase change random access memory (PRAM), a magnetic random access memory (MRAM), a resistive memory (ReRAM), a ferromagnetic memory (FRAM), or NOR flash memory. However, exemplary embodiments of the present inventive concepts are not limited to these types of memory chips and the memory chip 334 may be a different kind of semiconductor chip device from the semiconductor chip 230.

While the exemplary embodiment of FIG. 1 shows the first memory stack 350 and second memory stack 360 as each having six memory chips 334, the number of memory chips 334 constituting each memory stack (e.g., the first memory stack 350 and/or the second memory stack 360) is not limited thereto. Additionally, the stacked shape of the memory chips 334 is not limited to the shape shown in the exemplary embodiment of FIG. 1.

The second mold layer 370 may be formed on the second redistribution layer 310. Further, the second mold layer 370 may be formed between the plurality of memory stacks 350 and 360 and above the plurality of memory stacks 350 and 360. Since the description of the second mold layer 370 is the same as the description of the first mold layer 240, the description thereof is omitted herein for convenience of explanation.

Hereinafter, a method for fabricating the semiconductor package of FIG. 1 according to some exemplary embodiments of the present inventive concepts will be described with reference to FIGS. 2 to 12.

FIGS. 2 to 12 are diagrams illustrating steps of a method for fabricating the semiconductor package of FIG. 1 according to exemplary embodiments of the present inventive concepts.

Figure 2:
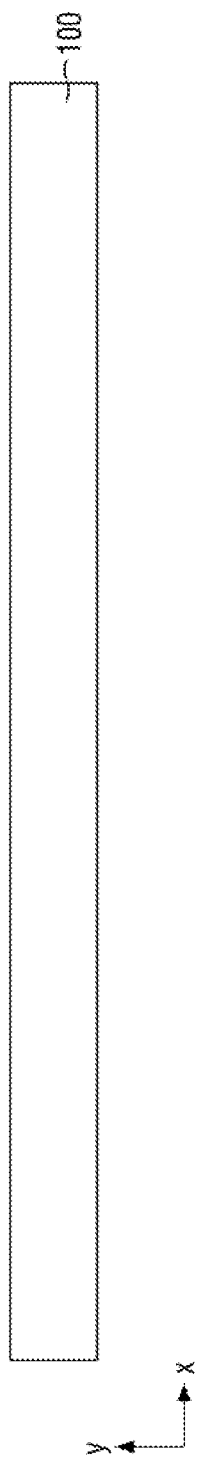
FIGS. 2 to 12 are cross-sectional views illustrating steps of a method for fabricating the semiconductor package of FIG. 1 according to exemplary embodiments of the present inventive concepts.

Referring to the exemplary embodiment of FIG. 2, a first carrier 100 may be disposed to fabricate the semiconductor package of FIG. 1 according to an exemplary embodiment of the present inventive concepts. The subsequent steps of the method for fabricating the semiconductor package according to some exemplary embodiments of the present inventive concepts may be performed on the first carrier 100.

In an exemplary embodiment, the first carrier 100 may be a glass carrier, a ceramic carrier, etc. However, exemplary embodiments of the present inventive concepts are not limited thereto. In an exemplary embodiment, the first carrier 100 may have a rounded top surface, and may have an approximate size of a silicon wafer. For example, the carrier may have a diameter of 8 inches, 12 inches, or the like. However, exemplary embodiments of the present inventive concepts are not limited thereto. In an exemplary embodiment, a release layer may be formed on the first carrier 100. The release layer may be formed of a polymer-based material (e.g., a light-to-heat conversion material) that can be removed with the first carrier 100 during the fabrication of the semiconductor package. In an exemplary embodiment, the release layer may be formed of an epoxy-based heat release material. In another exemplary embodiment, the release layer may be formed of an ultraviolet (UV) adhesive. The release layer may be formed by liquid spraying and curing. However, exemplary embodiments of the present inventive concepts are not limited thereto. For example, in some other exemplary embodiments, the release layer may be a laminate film that is laminated on the first carrier 100.

Figure 3:
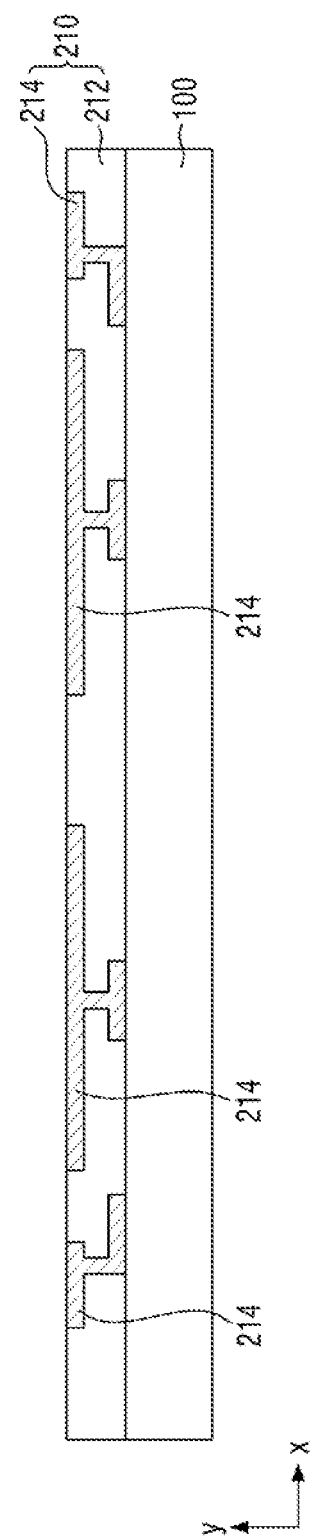

Referring to the exemplary embodiment of FIG. 3, a first redistribution layer 210 may be formed on the first carrier 100. The first redistribution layer 210 may include a first dielectric layer 212 and a first redistribution pattern 214. The first redistribution pattern 214 may be formed between the first dielectric layers 212.

In an exemplary embodiment, the first redistribution pattern 214 may be formed by forming a seed layer on the first dielectric layer 212, and forming a patterned mask on the seed layer to perform metal plating on the exposed seed layer. The first redistribution pattern 214 may be formed to have a shape as shown in the exemplary embodiment of FIG. 3 through at least a portion of the patterned mask and the seed layer covered by the patterned mask. In an exemplary embodiment, the seed layer may be formed using, for example, physical vapor deposition (PVD). However, exemplary embodiments of the present inventive concepts are not limited thereto. In an exemplary embodiment, the plating may be performed using electroless plating. Although it is illustrated that one redistribution layer is provided on the first carrier 100, exemplary embodiments of the present inventive concepts are not limited thereto and the number of redistribution layers may vary.

Figure 4:
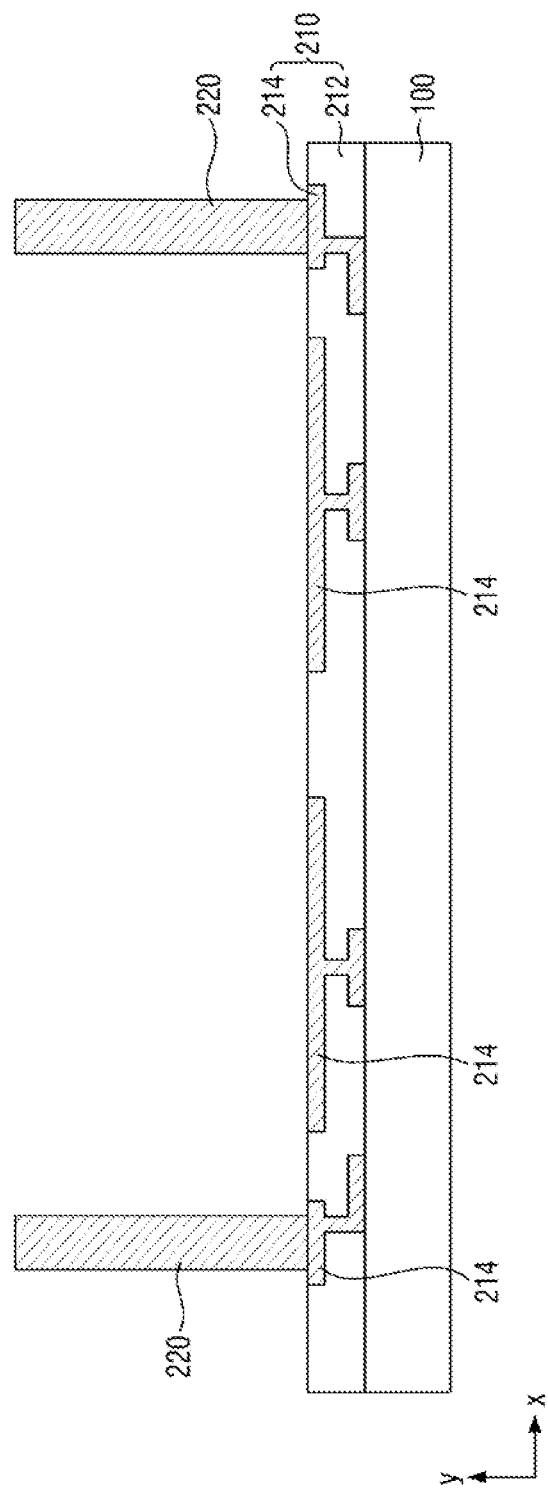

Referring to the exemplary embodiment of FIG. 4, a plurality of posts 220 may be formed on the first redistribution pattern 214.

In an exemplary embodiment, the plurality of posts 220 may be formed by plating. For example, the plurality of posts 220 may be formed, by forming a blanket seed layer on the first redistribution pattern 214, and then forming and patterning a photoresist on the seed layer exposed through openings in the photoresist. The photoresist and the seed layer covered by the photoresist may subsequently be removed. Although not shown, pads may be formed below the plurality of posts 220. The plurality of posts 220 may be electrically connected to the first redistribution pattern 214.

Figure 5:
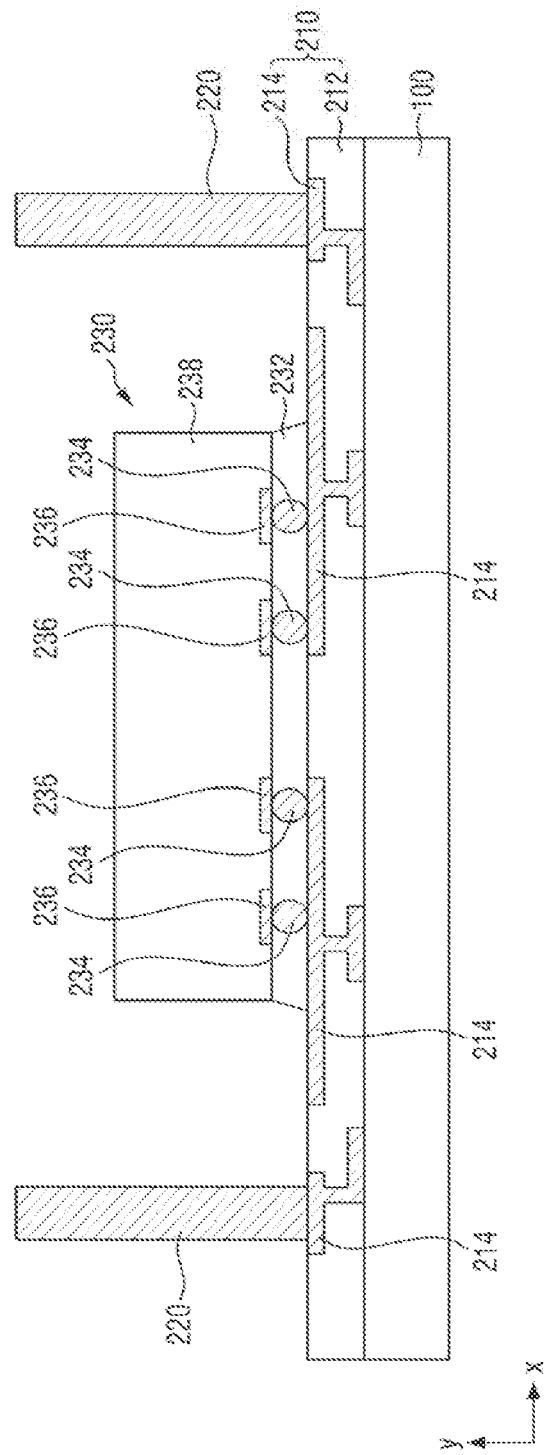

Referring to the exemplary embodiment of FIG. 5, a semiconductor chip 230 may be formed on the first redistribution layer 210. The semiconductor chip 230 may be formed between the plurality of posts 220 (e.g., in the X direction). The semiconductor chip 230 may be electrically connected to the first redistribution pattern 214. Since a detailed description of the semiconductor chip 230 overlaps with the description with reference to the exemplary embodiment of FIG. 1, the description thereof will be omitted.

The method for fabricating the semiconductor package according to some exemplary embodiments may be performed by a chip last method in which the semiconductor chip 230 is formed after the first redistribution layer 210 is formed.

Figure 6:
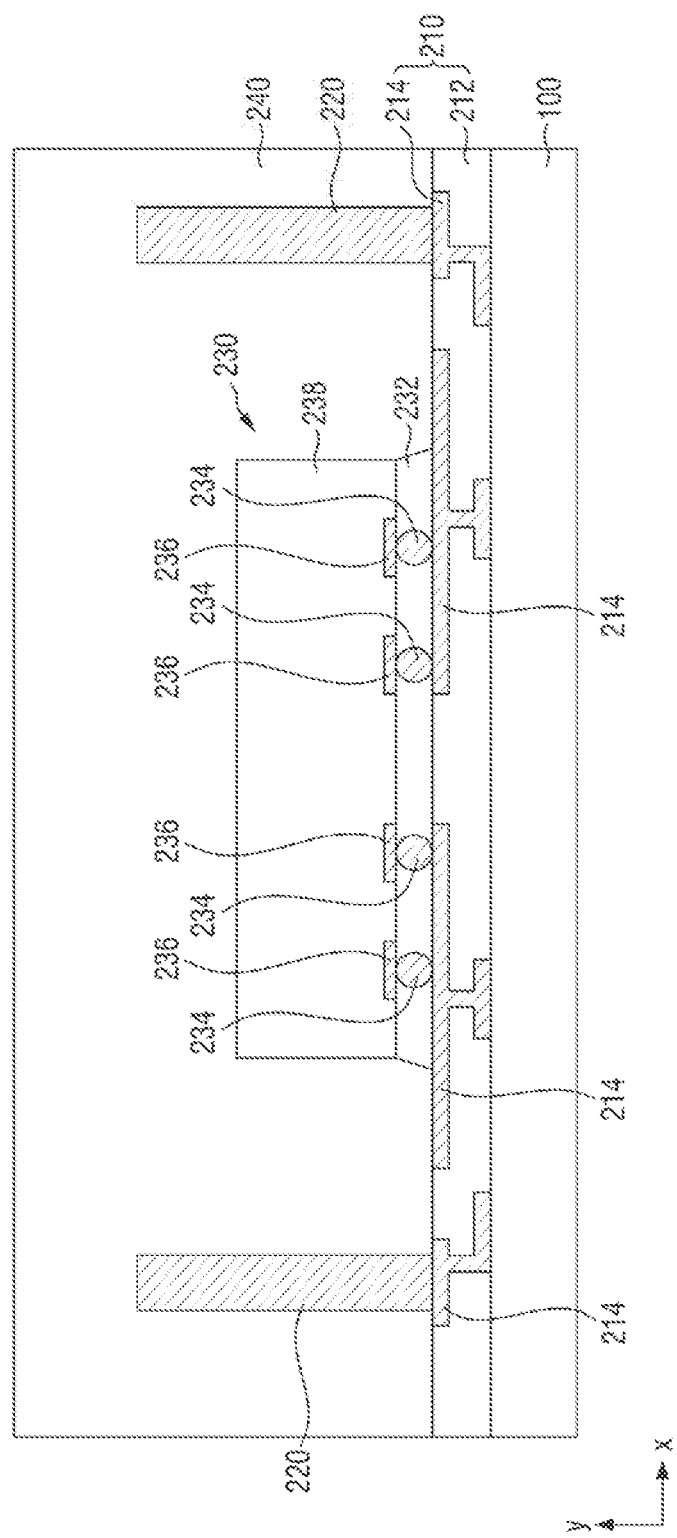

Referring to the exemplary embodiment of FIG. 6, a first mold layer 240 is formed on the first redistribution layer 210. The first mold layer 240 may surround lateral side surfaces and upper surfaces of the plurality of posts 220 and the semiconductor chip 230.

In an exemplary embodiment, the first mold layer 240 may include an epoxy molding compound. Since a detailed description of the first mold layer 240 overlaps with the description with reference to the exemplary embodiment of FIG. 1, the description thereof will be omitted for convenience of explanation.

Figure 7:
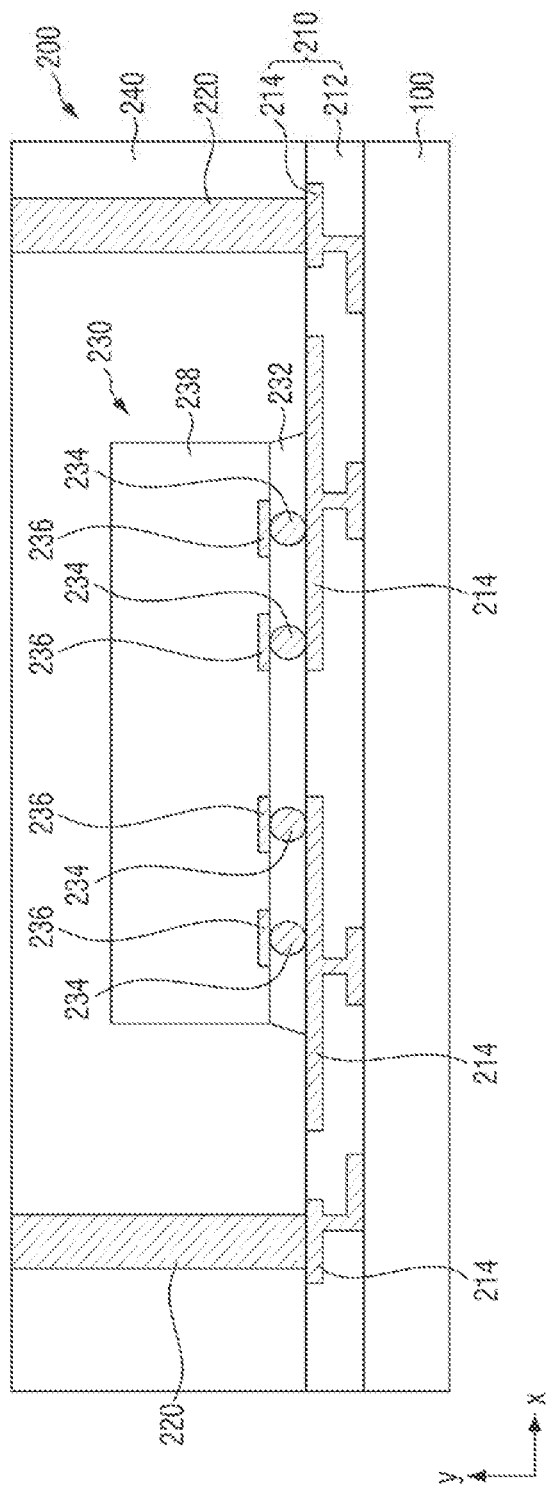

Referring to the exemplary embodiment of FIG. 7, the first mold layer 240 may be removed until the upper surfaces of the plurality of posts 220 in the Y direction are exposed. For example, the removal of the first mold layer 240 may be performed by chemical mechanical polishing (CMP) or grinding. However, exemplary embodiments of the present inventive concepts are not limited thereto. While the exemplary embodiment of FIG. 7 shows the upper surfaces of the plurality of posts 220 having a larger height (e.g., distance from an upper surface of the first redistribution layer 210 in the Y direction) than the semiconductor chip 230, in other exemplary embodiments, the upper surface of the semiconductor chip 230 and the upper surfaces of the plurality of posts 220 may be located at the same height.

Figure 8:
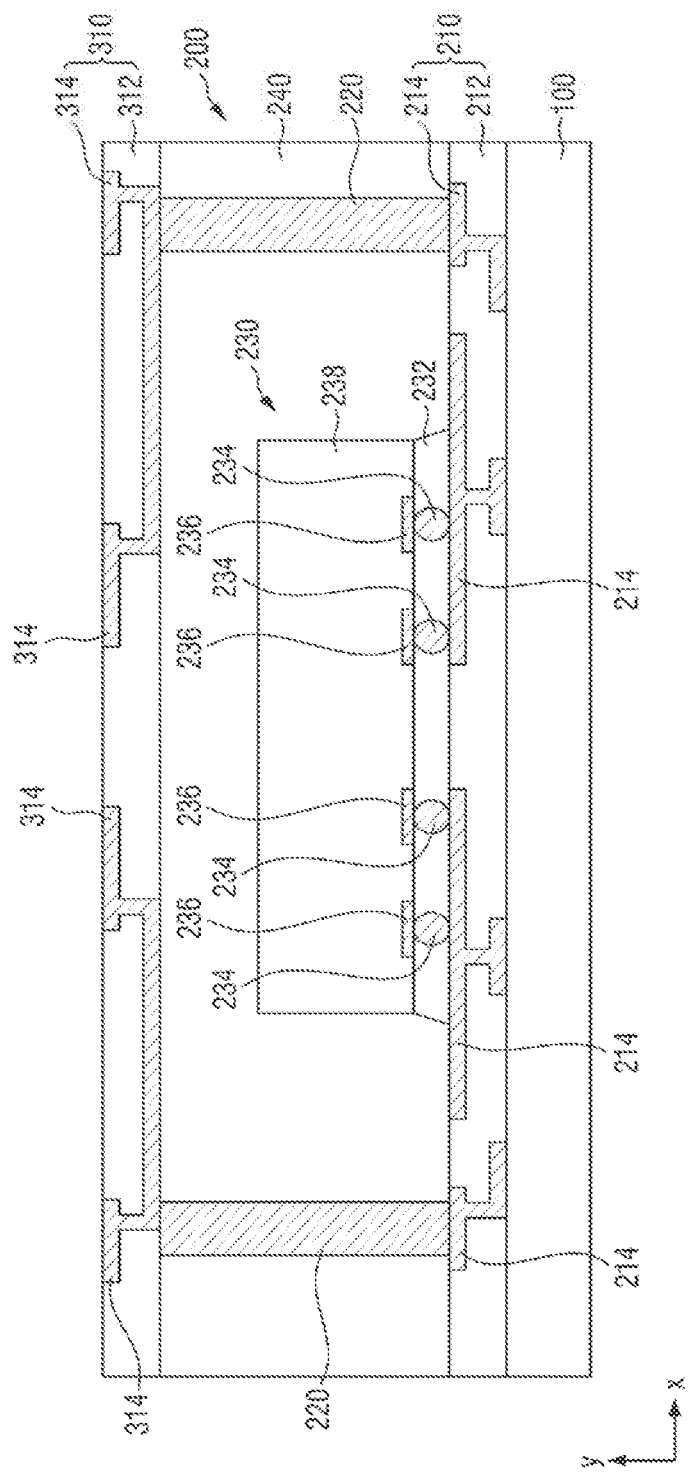

Referring to the exemplary embodiment of FIG. 8, a second redistribution layer 310 may be formed on upper surfaces of the first mold layer 240 and the plurality of posts 220. The second redistribution layer 310 may include a second dielectric layer 312 and a second redistribution pattern 314. The second redistribution pattern 314 may be formed between the second dielectric layers 312. Since a process of forming the second redistribution pattern 314 between the second dielectric layers 312 is the same as a process of forming the first redistribution pattern 214 between the first dielectric layers 212, a redundant description thereof will be omitted for convenience of explanation.

The second redistribution pattern 314 may be electrically connected to the plurality of posts 220. For example, a lower surface of the second redistribution pattern 314 may directly contact an upper surface of the post 220. The semiconductor package according to exemplary embodiments of the present inventive concepts may include a plurality of packages to be electrically connected to each other through a redistribution layer (e.g., the second redistribution layer 310), thereby thinning the thickness of the semiconductor package.

Figure 9:
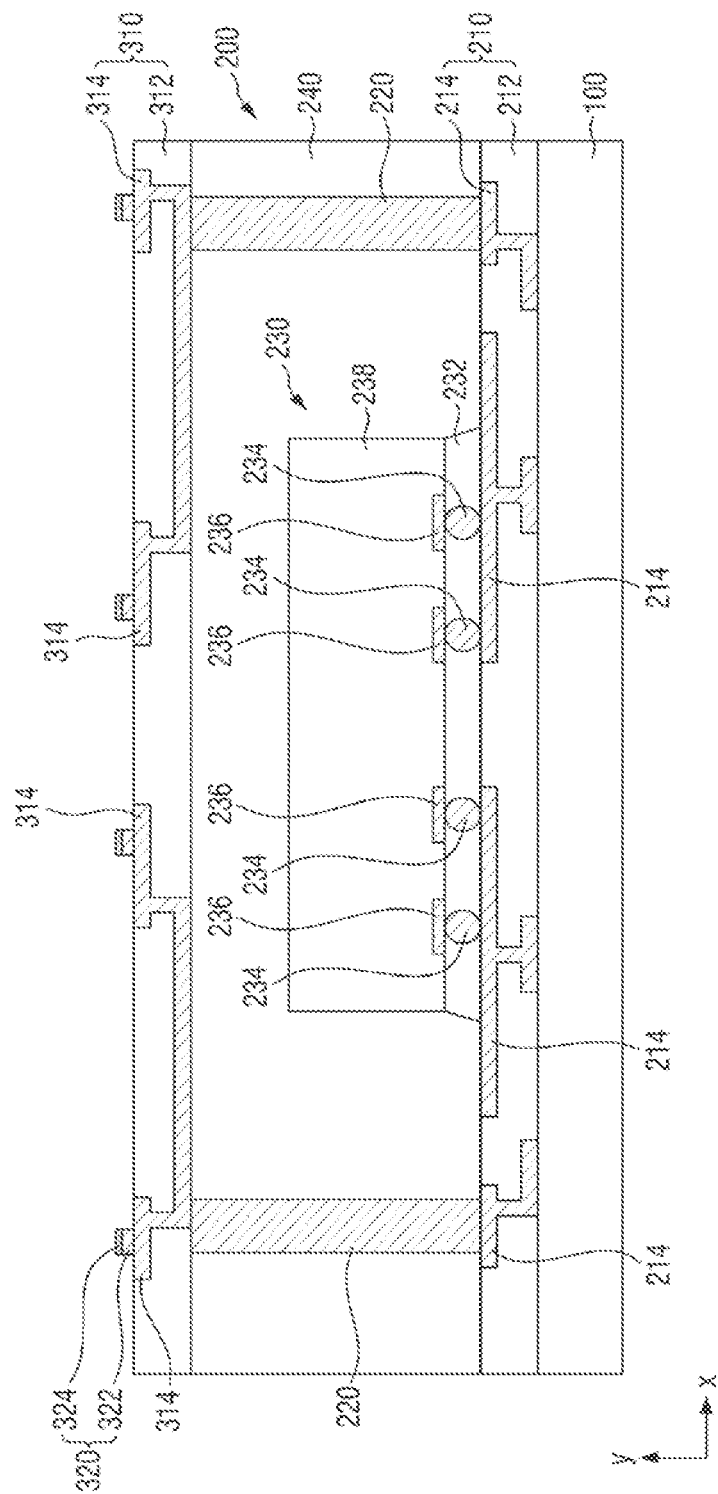

Referring to the exemplary embodiment of FIG. 9, a plurality of connecting pads 320 may be formed on the second redistribution pattern 314 exposed between the second dielectric layers 312 on an upper surface of the second redistribution layer 310. The plurality of connecting pads 320 may be spaced apart in the X direction.

Each of the plurality of connecting pads 320 may include a connection pad body 322 and a connection pad plating 324 on the connection pad body 322. Since a detailed description of the connection pad plating 324 formed on the connection pad body 322 is the same as the description with reference to the exemplary embodiment of FIG. 1, the description thereof will be omitted for convenience of explanation.

The connection pad plating 324 improves the reliability of wire bonding with a plurality of memory stacks to be formed in a subsequent fabricating process.

Figure 10:
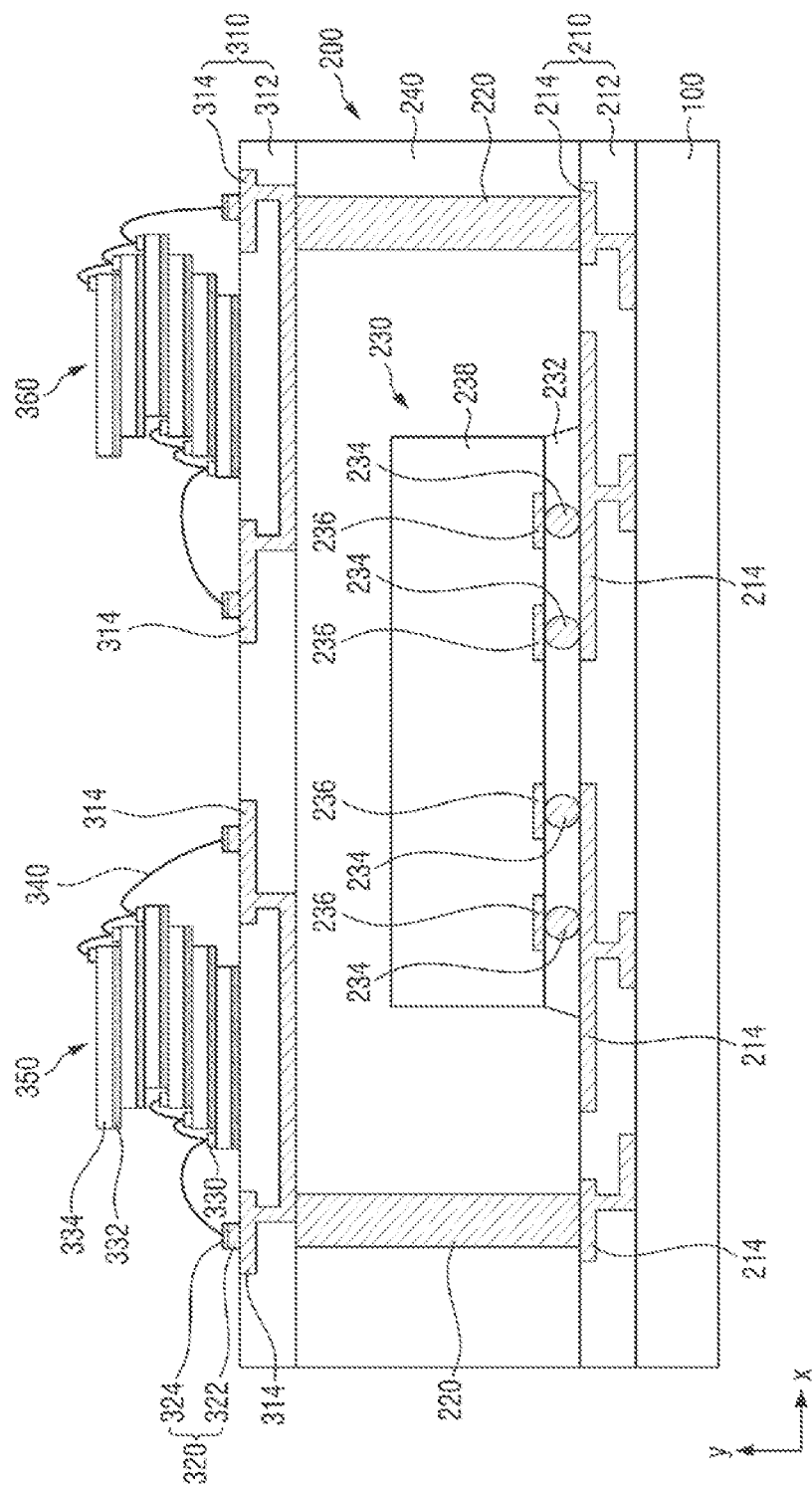

Referring to the exemplary embodiment of FIG. 10, a plurality of memory stacks 350 and 360 may be formed on an upper surface of the second redistribution layer 310. Each of the memory stacks 350 and 360 may be formed by stacking an adhesive film 332 and a memory chip 334 on the adhesive film 332. For example, a plurality of adhesive film layers and memory chips 334 may be alternatingly stacked. Since a detailed description of the plurality of memory stacks 350 and 360 is the same as the description with reference to the exemplary embodiment of FIG. 1, description thereof will be omitted for convenience of explanation.

Each of the plurality of memory stacks 350 and 360 may be electrically connected to the plurality of posts 220 through wire bonding. Wires 340 may electrically connect the plurality of connecting pads 320 on the second redistribution pattern 314 and the input/output pads 330 on the plurality of memory stacks 350 and 360 through wire bonding.

Figure 11:
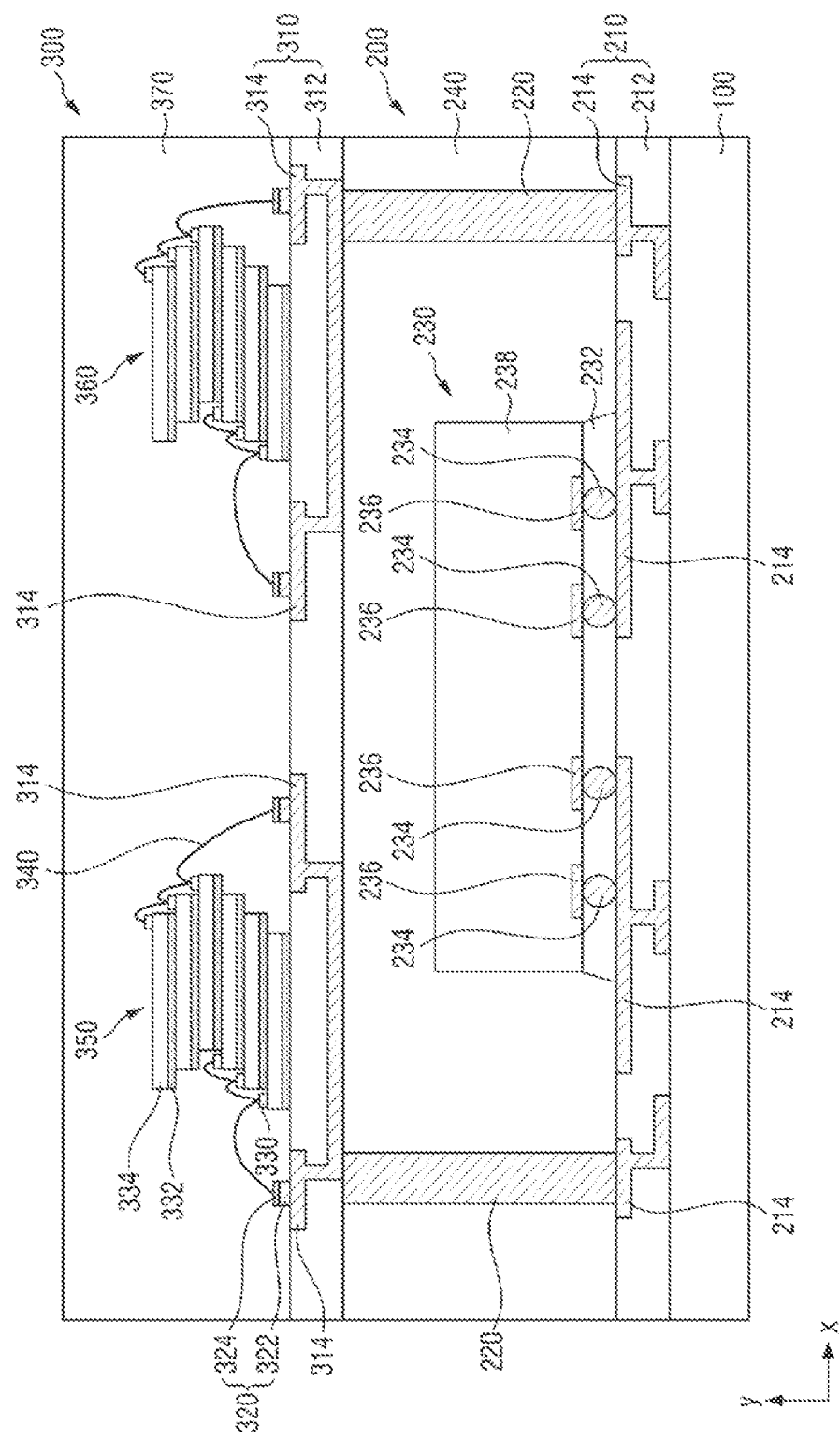

Referring to the exemplary embodiment of FIG. 11, a second mold layer 370 may be formed on an upper surface of the second redistribution layer 310. Further, the second mold layer 370 may be formed between the plurality of memory stacks 350 and 360 and on upper surfaces of the memory stacks 350 and 360. Since the description of the second mold layer 370 is the same as the description of the first mold layer 240 of FIG. 1, the description thereof will be omitted for convenience of explanation.

Figure 12:
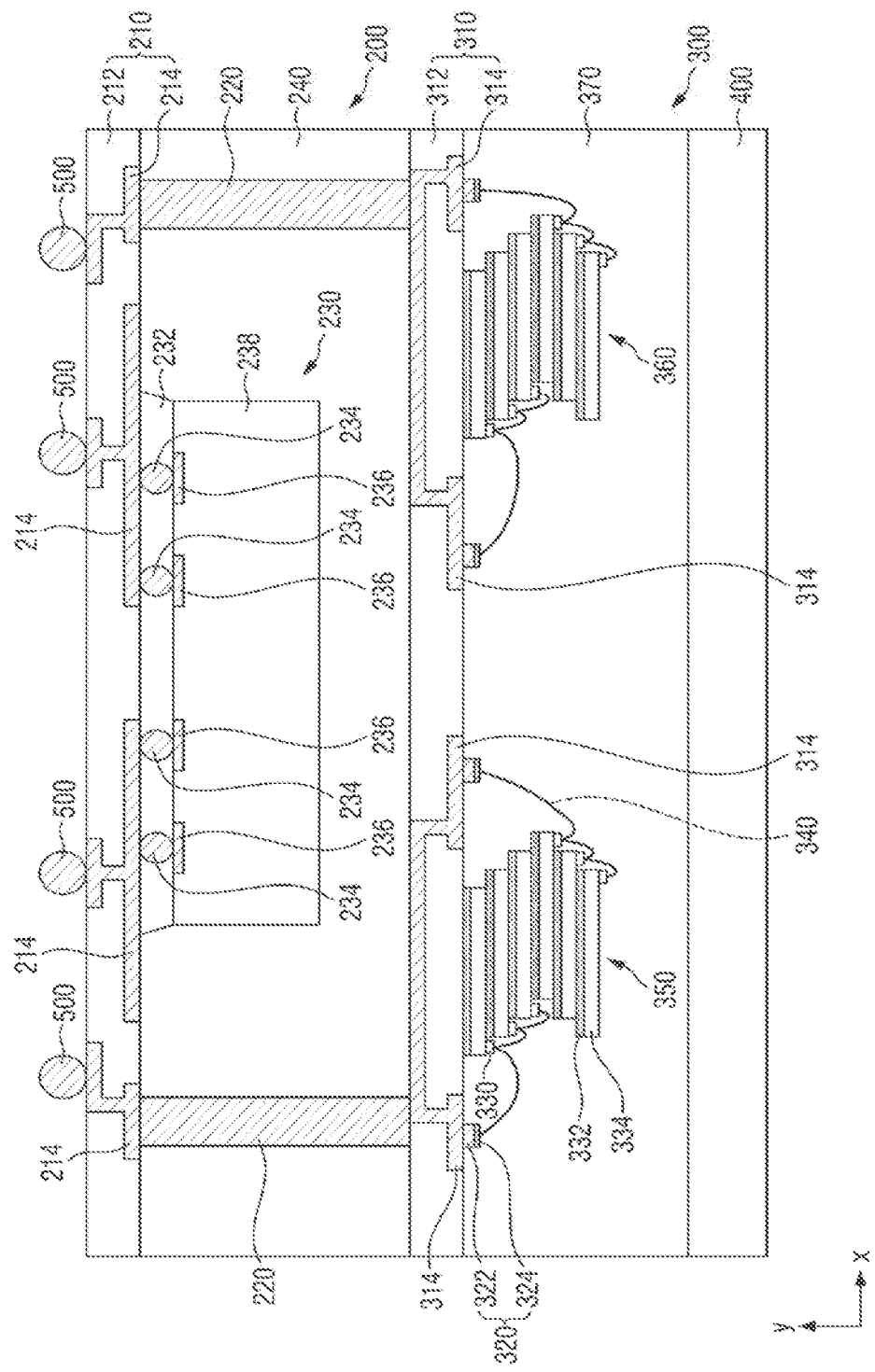

Referring to the exemplary embodiment of FIG. 12, the first carrier 100 is removed, the semiconductor package may be inverted so that the second mold layer 370 is oriented on the bottom of the semiconductor package and a second carrier 400 is formed in a direction facing the direction in which the first carrier 100 is formed. Since the description of the second carrier 400 is the same as the description of the first carrier 100 of the exemplary embodiment of FIG. 2, a redundant description thereof will be omitted.

The second carrier 400 may be formed on the second mold layer 370. Thereafter, a plurality of external connection terminals 500 may be formed on the first redistribution pattern 214 exposed between the first dielectric layers 212. Since the description of the plurality of external connection terminals 500 overlaps with the description with reference to FIG. 1, a detailed description thereof will be omitted.

Subsequently, the second carrier 400 is removed and the semiconductor package of the exemplary embodiment of FIG. 1 may be formed.

FIG. 13 is a cross-sectional view illustrating a semiconductor package according to another exemplary embodiment of the present inventive concepts.

The exemplary embodiment of FIG. 13 has the same features as the exemplary embodiment of FIG. 1 except that the number of the plurality of posts 220 is different from the semiconductor package of FIG. 1. The exemplary embodiment of FIG. 13 includes four posts 220 including two posts 220 adjacent a first lateral side of the semiconductor chip 230 and two posts 220 adjacent a second lateral side of the semiconductor chip 238. However, in other exemplary embodiments a different number of posts may be formed on the first redistribution layer 210.

In concluding the detailed description, those skilled in the art will appreciate that many variations and modifications can be made to the exemplary embodiments of the present inventive concepts without substantially departing from the principles of the present disclosure. Therefore, the disclosed exemplary embodiments of the present inventive concepts are used in a generic and descriptive sense only and not for purposes of limitation.

What is claimed is:

1. A semiconductor package comprising:
    a first redistribution layer including a first redistribution pattern;
    a plurality of posts disposed on the first redistribution layer;
    a semiconductor chip disposed on the first redistribution layer between the plurality of posts;
    a second redistribution layer formed on the plurality of posts and the semiconductor chip, the second redistribution layer including a second redistribution pattern; and
    a first memory stack disposed on the second redistribution layer,
    a plurality of connecting pads disposed on the second redistribution layer and extending above the second redistribution layer, wherein an entirety of a bottom surface of each of the plurality of connecting pads directly contacts the second redistribution pattern and is co-planar with an uppermost surface of the second redistribution layer,
    wherein the first memory stack is wire bonded to the plurality of connecting pads, and
    wherein a height of each of the plurality of posts extends from an upper surface of the first redistribution layer to a lower surface of the second redistribution layer.

2. The semiconductor package of claim 1, wherein: each of the plurality of connecting pads includes a connection pad body and a connection pad plating; and
    the connection pad plating is formed by performing gold plating on the connection pad body.

3. The semiconductor package of claim 1, wherein:
    the first memory stack includes a plurality of adhesive film layers alternatingly stacked with a plurality of memory chips;
    an input/output pad disposed on each of the plurality of memory chips; and
    the input/output pad is wire bonded to the plurality of connecting pads.

4. The semiconductor package of claim 1, wherein the semiconductor chip and the first memory stack are a different type of semiconductor chip device from each other.

5. The semiconductor package of claim 1, further comprising:
    a second memory stack disposed on the second redistribution layer,
    wherein the first memory stack is electrically connected to a first group of the plurality of posts, the first group including at least one of the plurality of posts, and
    wherein the second memory stack is electrically connected to a second group of the plurality of posts, the second group including all of the plurality of posts not in the first group of the plurality of posts.

6. The semiconductor package of claim 1, wherein the first redistribution pattern is configured to electrically connect the first redistribution layer to the plurality of posts.

7. The semiconductor package of claim 6, wherein the second redistribution pattern is configured to electrically connect to the plurality of posts to electrically connect the second redistribution layer to the first redistribution layer.

8. The semiconductor package of claim 1, further comprising:
a first mold layer disposed on the first redistribution layer and extending between the first redistribution layer and the second redistribution layer,
wherein the first mold layer is in contact with the plurality of posts.

9. The semiconductor package of claim 8, further comprising:
a second mold layer disposed on the second redistribution layer.

10. A method for fabricating a semiconductor package, comprising:
forming a first redistribution layer including a first redistribution pattern;
forming a plurality of posts on the first redistribution layer by plating;
disposing a semiconductor chip on the first redistribution layer between the plurality of posts after the plurality of posts is formed on the first redistribution layer;
forming a second redistribution layer on the plurality of posts and the semiconductor chip, the second redistribution layer including a second redistribution pattern;
forming a plurality of connecting pads on the second redistribution layer, wherein an entirety of a bottom surface of each of the plurality of connecting pads directly contacts the second redistribution pattern and is co-planar with an uppermost surface of the second redistribution layer, and
forming a first memory stack on the second redistribution layer,
wherein each of the plurality of posts has a height that extends from an upper surface of the first redistribution layer to a lower surface of the second redistribution layer.

11. The method of claim 10, wherein the first memory stack is wire bonded to the plurality of connecting pads.

12. The method of claim 11, wherein the forming of the plurality of connecting pads comprises:
forming a connection pad body; and
forming a connection pad plating on the connection pad body by performing gold plating on the connection pad body.

13. The method of claim 11, wherein the forming of the first memory stack comprises:
forming a plurality of adhesive film layers and alternatingly stacking the plurality of adhesive film layers with a plurality of memory chips;
forming an input/output pad on each of the plurality of memory chips; and
wire bonding the input/output pad to the plurality of connecting pads.

14. The method of claim 10, wherein the semiconductor chip and the first memory stack are a different type of semiconductor chip device from each other.

15. The method of claim 10, further comprising:
forming a second memory stack on the second redistribution layer,
wherein the first memory stack is electrically connected to a first group of the plurality of posts, the first group including at least one of the plurality of posts, and
wherein the second memory stack is electrically connected to a second group of the plurality of posts, the second group including all of the plurality of posts not in the first group of the plurality posts.

16. The method of claim 10, wherein the first redistribution pattern is configured to electrically connect the first redistribution layer to the plurality of posts.

17. The method of claim 16, wherein the second redistribution pattern is configured to electrically connect to the plurality of posts to electrically connect the second redistribution layer to the first redistribution layer.

18. The method of claim 10, further comprising:
forming a first mold layer on the first redistribution layer and extending between the first redistribution layer and the second redistribution layer,
wherein the first mold layer contacts the plurality of posts.

19. A semiconductor package comprising:
a plurality of external connection terminals;
a first redistribution layer disposed on the plurality of external connection terminals, the first redistribution layer including a first dielectric layer and a first redistribution pattern electrically connected to the plurality of external connection terminals;
a plurality of posts disposed on the first redistribution layer;
a semiconductor chip disposed on the first redistribution layer between the plurality of posts;
a first mold layer surrounding the plurality of posts and the semiconductor chip;
a second redistribution layer disposed on the first mold layer and the plurality of posts, the second redistribution layer including a second dielectric layer and a second redistribution pattern electrically connected to the plurality of posts;
a plurality of connecting pads disposed on the second redistribution layer and extending above the second redistribution layer wherein an entirety of a bottom surface of each of the plurality of connecting pads directly contacts the second redistribution pattern and is co-planar with an uppermost surface of the second redistribution layer, and
a plurality of memory stacks disposed on the second redistribution layer, the plurality of memory stacks are wire bonded to the second redistribution layer,
wherein a height of each of the plurality of posts extends from an upper surface of the first redistribution layer to a lower surface of the second redistribution layer.

20. The semiconductor package of claim 19, wherein an upper surface of each of the plurality of posts has a same height as a lower surface of the first dielectric layer.

\* \* \* \* \*